(12) United States Patent
Marten

(10) Patent No.: US 6,501,342 B2
(45) Date of Patent: Dec. 31, 2002

(54) POWER-CONSERVING EXTERNAL CLOCK FOR USE WITH A CLOCK-DEPENDENT INTEGRATED CIRCUIT

(75) Inventor: Victor Marten, Flushing, NY (US)

(73) Assignee: Semtech Corporation, Newbury Park, CA (US)

( * ) Notice: Subject to any disclaimer, the term of this patent is extended or adjusted under 35 U.S.C. 154(b) by 170 days.

(21) Appl. No.: 10/048,704

(22) PCT Filed: Jan. 27, 2001

(86) PCT No.: PCT/US01/02758

§ 371 (c)(1),
(2), (4) Date: Oct. 26, 2001

(87) PCT Pub. No.: WO01/56145

PCT Pub. Date: Aug. 2, 2001

(65) Prior Publication Data

US 2002/0145477 A1 Oct. 10, 2002

Related U.S. Application Data

(60) Provisional application No. 60/178,887, filed on Jan. 28, 2000.

(51) Int. Cl.$^7$ ............................. H03B 1/00; H03B 5/00; H03B 5/08; H03B 5/20; H03B 5/30
(52) U.S. Cl. ........................ 331/173; 331/74; 331/150; 327/291; 327/299
(58) Field of Search ................................ 331/49, 107 R, 331/108 C, 116 R, 116 FE, 158, 173, 74, 75, 143, 150; 327/291, 299

(56) References Cited

U.S. PATENT DOCUMENTS 3,855,549 A * 12/1974 Huener et al. .......... 331/108 D
5,982,246 A    11/1999 Hofhine et al.

* cited by examiner

Primary Examiner—David C. Mis
(74) Attorney, Agent, or Firm—Oppedahl & Larson LLP

(57) ABSTRACT

The problem of undesired power consumption in an oscillator during "stop" periods of a device is addressed by providing the oscillator in apparatus external to the device, the apparatus including a current sensor sensing current in a line between the apparatus and the device, the line communicating an oscillator "clock" signal. If the device enters a "stop" state the current flow during certain half-cycles of the oscillation is relatively low compared to the current flow in the "no-stop" state. In response to the relatively low current, the apparatus halts oscillation. Later, when the device exits the "stop" state, current flow increases in the line, and the apparatus resumes oscillation, thereby resuming the communication of the clock signal to the device. Alternatively the apparatus monitors two oscillator lines by means of an XOR gate, powering down the oscillator when the XOR output goes low and restoring the oscillator when the XOR output goes high.

18 Claims, 3 Drawing Sheets

POWER-CONSERVING EXTERNAL CLOCK FOR USE WITH A CLOCK-DEPENDENT INTEGRATED CIRCUIT

This application claims priority from U.S. appln. No. 60/178,887, filed Jan. 28, 2000, which application is incorporated herein by reference.

BACKGROUND

Recent popularity of portable, battery-powered electronic appliances has prompted intense pressure to maximize battery life by cutting power consumption in the appliances. The system designer attempting to respond to this pressure will scrutinize every part of a system to attempt to identify opportunities to save power.

Some integrated circuits, including microprocessors and microcontrollers, depend upon an oscillator to provide a clock for clocking various processes. The oscillator typically draws a non-negligible portion of the energy budget, and is thus a natural target of the system designer in efforts to conserve power. Thoughtful analysis of the functions provided by the integrated circuit in relation to the system in which it functions will often identify some regimes of operation in which the integrated circuit could slow down or halt, thus conserving power.

If the integrated circuit uses an internal oscillator with an external crystal or resonator, then the oscillator takes some time to stabilize each time it is started, and for short tasks the stabilization time may account for a large portion of the "on" time for the oscillator. This is wasteful of power.

If the integrated circuit uses an external oscillator of conventional design, then it is generally not within the ability of the designer of the external oscillator to power down the oscillator at the right times and power it up again at the right times, for the simple reason that the events that would desirably trigger such powering-up and powering-down are internal to the integrated circuit and thus are not easily externally discernable.

For system designers concerned with reducing power consumption to the greatest extent possible, it would be extremely desirable to have an external clock apparatus which could discern the internal use state of an integrated circuit so as to power-up and power-down an oscillator as needed, based on the internal state. Such apparatus would desirably require no pins on the integrated circuit other than pins already provided for clock purposes, and would desirably itself take up very little space.

SUMMARY OF THE INVENTION

The problem of undesired power consumption in an oscillator during "stop" periods of a device is addressed by providing the oscillator in apparatus external to the device, the apparatus including a current sensor sensing current in a line between the apparatus and the device, the line communicating an oscillator "clock" signal. If the device enters a "stop" state the current flow during certain half-cycles of the oscillation is relatively low compared to the current flow in the "no-stop" state. In response to the relatively low current, the apparatus halts oscillation. Later, when the device exits the "stop" state, current flow increases in the line, and the apparatus resumes oscillation, thereby resuming the communication of the clock signal to the device. Alternatively the apparatus monitors two oscillator lines by means of an XOR gate, powering down the oscillator when the XOR output goes low and restoring the oscillator when the XOR output goes high.

DESCRIPTION OF THE DRAWING

The invention will be described with respect to a drawing in several figures, of which.

Where possible, like elements have been denoted among the figures using like reference numerals.

DETAILED DESCRIPTION

Figure 1:
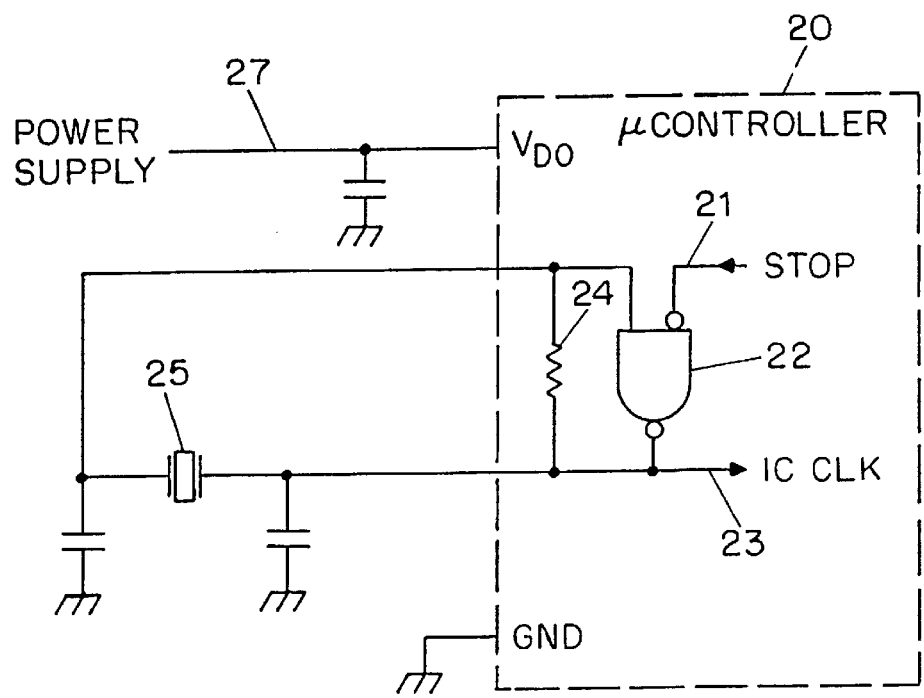
FIG. 1 shows in schematic and functional block diagram from a typical oscillator-dependent device employing an internal oscillator with an external crystal or resonator.

For a full portrayal of exemplary embodiments of the invention, it is helpful to describe prior-art conventional ways of providing oscillators in clock-dependent integrated circuits such as microcontrollers and microprocessors. FIG. 1 shows in schematic and functional block diagram form a typical oscillator-dependent device (here, a microcontroller 20) employing an internal oscillator (NAND gate 22 and related components such as feedback resistor 24) with an external crystal or resonator 25. A "stop" signal is defined within the microcontroller which permits the microcontroller to turn the oscillator on and off in response to conditions defined elsewhere.

It should be appreciated that the conditions under which the microcontroller would stop itself and remove the "stop" signal may be any of a variety of conditions, but the particular conditions are not critical to this discussion. It suffices that there are times when the microcontroller may choose to issue the "stop" signal and other times when it may choose to remove the "stop" signal, and that it would be desirable to be able to save power during the "stop" times.

The designer of the microcontroller might select a NOR gate instead of a NAND gate, the significance of which with respect to the invention will be discussed below.

The arrangement of FIG. 1 has the drawback that the crystal or ceramic resonator may take a long time to start oscillations and to stabilize its frequency.

Figure 2:
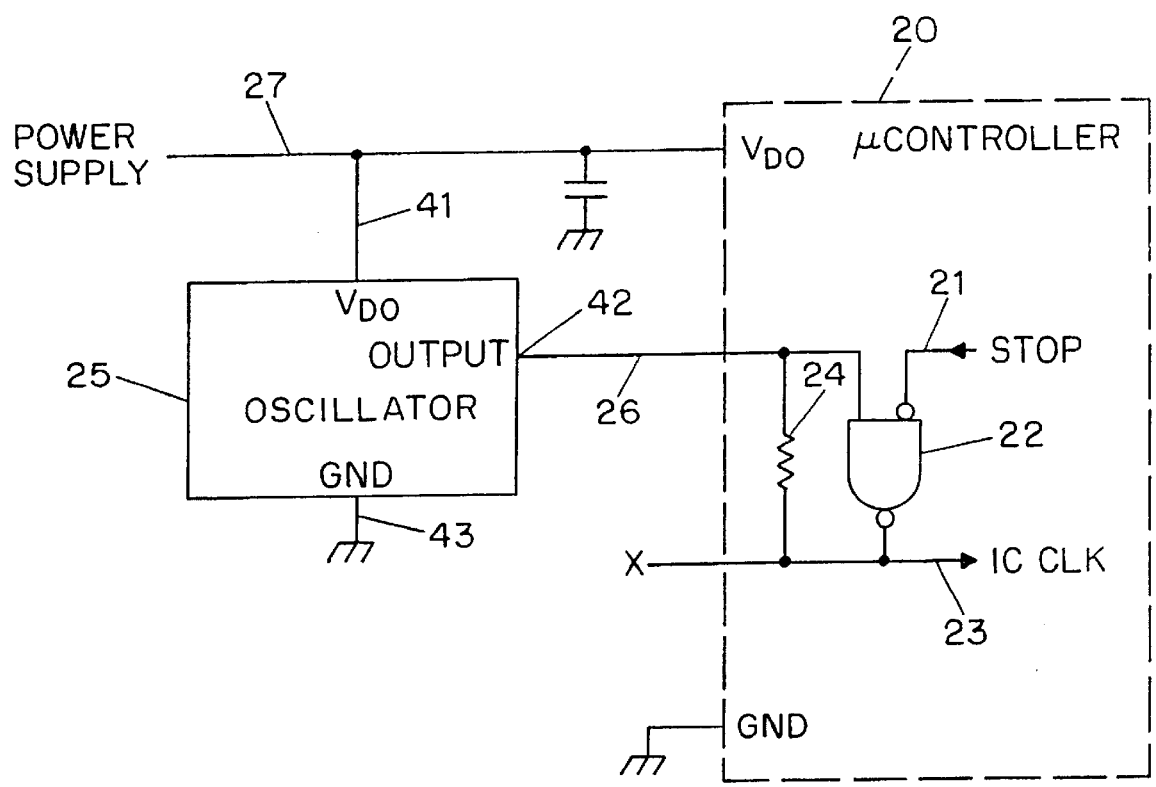
FIG. 2 shows in schematic and functional block diagram form a typical oscillator-dependent device receiving a clock signal from an external oscillator.

FIG. 2 shows in schematic and functional block diagram form a typical oscillator-dependent device such as a microcontroller 20 receiving a clock signal on line 26 from an external oscillator 25. This arrangement has the drawback that the external oscillator 25 is running all the time, and thus consumes a significant amount of power.

Figure 3:
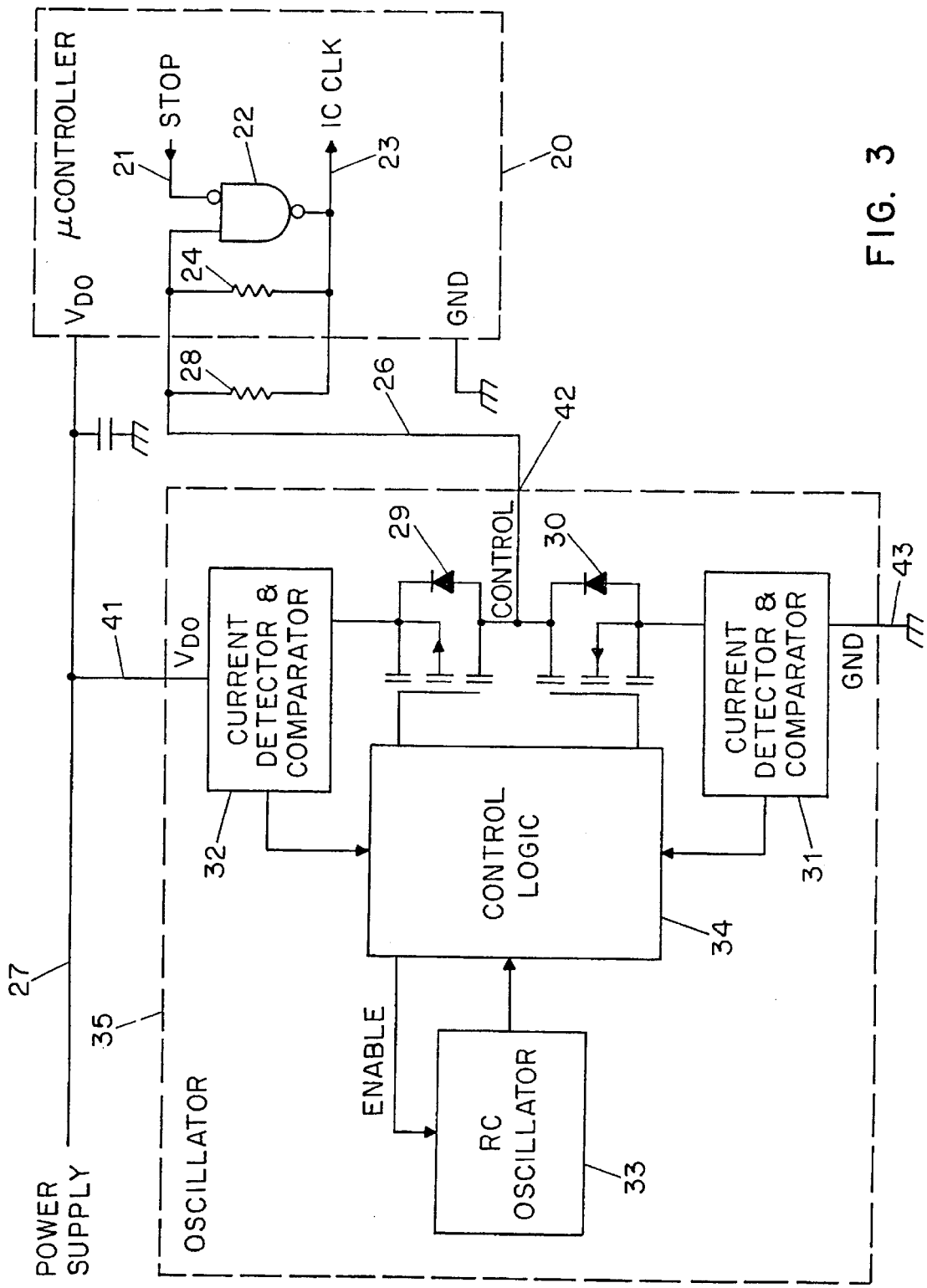
FIG. 3 shows in schematic and functional block diagram form a typical oscillator-dependent device receiving a clock signal from a power-saving external oscillator according to the invention.

FIG. 3 shows in schematic and functional block diagram form a typical oscillator-dependent device such as microcontroller 20 receiving a clock signal via line 26 from a power-saving external oscillator apparatus 35 according to the invention. In an exemplary embodiment, the apparatus 35 may have as few as three pins, 41, 42, 43, where 41 and 43 provide power and 42 is the pin connecting to line 26. Switches 29, 30 are shown as MOSFETs but other switches could be used as well. Switches 29, 30 provide a push-pull driver in which line 26 is pulled up to the power supply level when switch 29 is on, and in which line 26 is pulled down to ground level when switch 30 is on. It is important that the control logic 34 include a provision preventing switches 29 and 30 from being turned on simultaneously, since this would provide a short or near-short between power and ground.

In normal oscillator action, the oscillator 33 is on, providing an oscillating signal which alternately turns on switches 29 and 30. In this way a clock signal, typically a square wave, is provided on line 26 and provides a clock signal on line 23 within the microcontroller 20. The microcontroller 20 is able to function normally with its processes clocked by the clock signal.

During each cycle of the clock signal, switch 29 turns on the then switch 30 turns on, and this proceeds in alternation. It will be appreciated that some detectible level of current must flow during each half-cycle, so as to overcome non-zero parasitic capacitances within the microcontroller 20, associated with line 26. Current detectors 31, 32 are provided to sense the current level and to compare it with some predetermined threshold.

Consider, then, what happens if for some reason the microcontroller 20 chooses to assert its "stop" signal 21, that is, to set i "high." In such a case, the output of gate 22, as measured at line 23, is forced to become "high." The clock signal from line 26 is isolated by resistor 24 (or 28) and does not propagate to line 23. In this way, the microcontroller 20 enters its "stop" state.

It is at this point the power consumed in a prior-art external oscillator 25 (FIG. 2) becomes wasted power. But the apparatus 35 (FIG. 3) will detect a smaller-than-expected current in detector 32, since the potential on both sides of the detector is roughly the same. (The signal at 23 is high and the signal at pin 42 is high.) The smaller-than-expected current is communicated to control logic 34 which then removes the "enable" signal at the RC oscillator 33. The oscillator halts, thus conserving energy and prolonging battery life.

It may be expected that at some later time, the microcontroller 20 may choose to remove its "stop" signal so that it may resume clocked activity. In such an event, line 23 is no longer being forced high by the output of gate 22. With switch 29 on, the current detector 32 may detect current, and this will prompt the control logic 34 to re-enable the oscillator 33. Its output is again gated to switches 29, 30 and thus provides a clock on line 26 and thus to internal line 23.

Depending on the particular microcontroller 20, it may prove necessary to provide external resistor 28 paralleling the internal resistor 24, so as to provide a sufficiently low impedance connection between the NAND gate output at line 23 and the current detectors 31, 32.

It will be appreciated that depending on the particular internal design of the microcontroller 20, it might prove sufficient to provide only one of the current detectors 31, 32. In the example of FIG. 3, the "high" condition of line 23 during a "stop" condition will lead to relatively low current through the "high" driver 29 and thus through the current detector 32. It might then be possible to omit the current detector 31. It will also be appreciated however, that this depends on a particular internal configuration of the microcontroller 20, that such an internal configuration might well not be defined by manufacturer's specifications. This, while the microcontroller example of FIGS. 1, 2 and 3 shows line 23 to be "high" during a "stop" condition, the microcontroller designer might just as well make the opposite choice, with line 23 being "low" during a "stop" condition. This could occur, for example, if the designer of the microcontroller 20 were to select a NOR gate rather than a NAND gate for use within the microcontroller 20. In such a case, detector 31 would detect the "stop" condition. As such, it may be preferable to provide both detectors 31, 32.

It should be appreciated that the apparatus 35 of FIG. 3 comes close to being pin-for-pin compatible with the apparatus 25 of FIG. 2, yet consumes far less power.

The embodiment of FIG. 3 contemplates two current detectors, one in series with switch 29 and another in series with switch 30. It might be possible, but is considered less desirable, to use a single bidirectional current detector, in series with pin 42.

What has been described is an oscillator apparatus which stops oscillating when the microcontroller executes a "stop" instruction, and accomplishes this result without requiring any extra control lines and without any complicated oscillator controls. The apparatus restarts as soon as the microcontroller exits "stop" mode. This may, for example, be in response to an external interrupt.

With the apparatus of FIG. 3, the oscillator frequency is immediately stable, which is preferable to some prior art arrangements where it may take some time for the frequency to stabilize.

What is described is an arrangement where the RC oscillator 33 runs when the appropriate current detector (31 or 32) indicates sufficient current flowing through the feedback resistor 24. Some microcontroller units may require a sufficiently small external feedback resistor 28, since the internal feedback resistor 24 is often increased or disconnected after the preset oscillator stabilization period.

It is instructive to consider whether the arrangement of FIG. 3 really does conserve power as compared with the arrangements of FIGS. 1 and 2. The added resistor 28 does not contribute at all to the power consumption during "stop" mode. Even when the oscillator 33 is running its effect is small. For example even a low-power microcontroller 20 will consume several hundred $\mu A$, while adding merely a 100K resistor in position 28 in a 5-volt system will append only 50 $\mu A$.

It should be also appreciated that while the examples of FIGS. 1, 2 and 3 show particular polarities (e.g. negative ground) and signal conventions (e.g. "stop" signal being a logic "1"), this is quite arbitrary and the invention could quite well be practiced with different polarities and signal conventions, without deviating in any way from the invention.

It is to be expected that during the beginning of a half-cycle, the current detectors 31, 32 would pick up currents which merely charge up some parasitic capacitances. Thus it is considered preferable to program the apparatus so that the current detectors 31, 32 are disabled during the beginning of each half-cycle, when parasitic capacitances for examples on the clock line 26 may be non-negligible and could trick the detector into thinking that it necessary to continue the oscillation.

Overall power consumption of the system is actually reduced, in the invention, in part because the built-in oscillator circuit does not operate in the linear region.

It should be appreciated that with the apparatus 35 (FIG. 3), timing is controlled only by the RC oscillator. Importantly, the value of the feedback resistor 24, 28 and amount of parasitic capacitance do not influence the timing and do not contribute the click jitter. Clock line changes are always evoked and controlled by the strong drivers 29, 30 rather than by the feedback resistor.

Stated differently, the apparatus includes an oscillator 33 having a control line, the oscillator 33 responding to the control line being in a first state by providing an oscillator output. The apparatus has control logic 34 powered by the first and third terminals 41, 43, the control logic connected with and controlling the control line of the oscillator 33. The apparatus has a first switch 29 and a first current sensor 32 having a first output in series between a first one of the first and third terminals via and the second terminal, the first switch controlled by the control logic, the first output connected with and provided to the control logic. The apparatus has a second switch 30 connected to a second one of the first and third terminals, and connected to the second terminal 42, the second switch controlled by the control logic 34.

The control logic 34 is characterized in that upon the condition of the first output being indicative of current in excess of a first predetermined threshold, the control logic actuates the control line whereby the oscillator 33 oscillates, yielding an oscillating signal at the oscillator output.

The control logic 34 needs to be responsive to the oscillating signal by repeatedly turning on the first and second switches 29, 30 in alternation according to the oscillating signal.

The control logic 34 may be further characterized in that upon the condition of the first output being indicative of current below a second predetermined threshold, the control logic deactuates the control line whereby the oscillator 33 ceases oscillation.

It is considered preferable to use the topology of FIG. 3, in which first switch 29 has been placed between the first current sensor 32 and the second terminal 42. It would also be possible to place the first current sensor 32 between the first switch 29 and the second terminal 42, and wherein the second switch 30 connects to the second terminal 42 via the first current sensor 32.

The invention may be described with respect to a method, the method comprising the steps of: detecting any current flow between a first one of the first and third terminals and the second terminal; in the event of the current flow being in excess of a first predetermined threshold, repeatedly turning on the first and second switches in alternation; and in the event of the current flow being below a second predetermined threshold, ceasing the repeated turning on the first and second switches in alternation.

The circuitry of FIG. 3 is described with respect to current detectors, but it should be appreciated that the desirable results may be accomplished by indirect means such as measuring voltages at particular locations in the circuit, and thereby inferring the currents which permit discerning the condition of the line 23.

Figure 4:
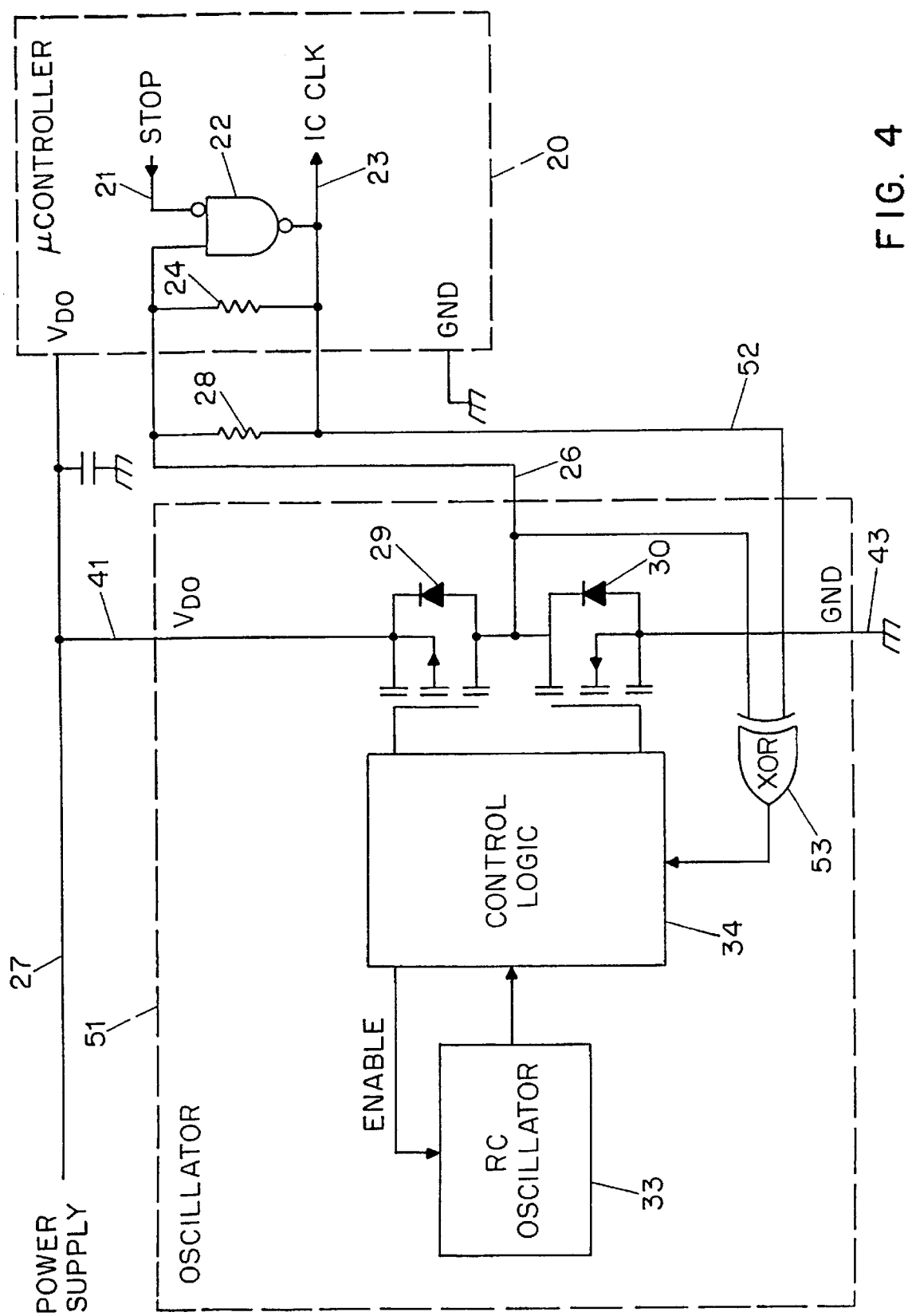
FIG. 4 shows in schematic and functional block diagram form an alternative embodiment of a power-saving external oscillator according to the invention.

Turning now to FIG. 4, what is shown is an alternative embodiment of apparatus 51 according to the invention. One difference (as compared with FIG. 3) is the absence of the current detectors 31, 32. Another difference is that an additional clock line 52 connects the microcontroller 20 and the apparatus 51. Finally, within apparatus 51 is XOR gate 53.

When the microcontroller 20 is in its normal (not stopped) state, then the two lines 26, 52 are generally in opposite states at any particular moment, The XOR gate 53 has a positive output. (Preferably, the output of XOR gate 53 is checked shortly before the clock output 42 is going to change, so that the states of the two lines 26, 52 will have settled fully.)

When the microprocessor 20 enters a "stop" state, however, then the lines 26, 52 have the same state. The output of the XOR gate 53 goes low. The control logic 34 shuts down the oscillator 53.

Later the microcontroller 20 leaves the "stop" state. The output of the XOR gate 53 goes high again. The control logic 34 re-enables the oscillator again.

Those skilled in the art will have no difficulty devising myriad obvious variations and improvements upon the invention without departing from the invention in any way, all of which are intended to be encompassed by the claims that follows.

What is claimed is:

1. An apparatus with first, second, and third terminals, the apparatus comprising:

an oscillator having a control line, the oscillator responding to the control line being in a first state by providing an oscillator output;

control logic powered by the first and third terminals, the control logic connected with and controlling the control line;

a first switch and a first current sensor having a first output in series between a first one of the first and third terminals via and the second terminal, the first switch controlled by the control logic, the first output connected with and provided to the control logic;

a second switch connected to a second one of the first and third terminals, and connected to the second terminal, the second switch controlled by the control logic;

the control logic characterized in that upon the condition of the first output being indicative of current in excess of a first predetermined threshold, the control logic actuates the control line whereby the oscillator oscillates, yielding an oscillating signal at the oscillator output;

the control logic responsive to the oscillating signal by repeatedly turning on the first and second switches in alternation according to the oscillating signal;

the control logic further characterized in that upon the condition of the first output being indicative of current below a second predetermined threshold, the control logic deactuates the control line whereby the oscillator ceases oscillation;

the control logic comprising means preventing simultaneous turning on of the first switch and the second switch.

2. The apparatus of claim 1 wherein the first current sensor is between the first switch and the second terminal, and wherein the second switch connects to the second terminal via the first current sensor.

3. The apparatus of claim 1 wherein the first switch is between the first current sensor and the second terminal.

4. The apparatus of claim 1 wherein the control logic is further characterized in that the condition of the first output being indicative of current in excess of the first predetermined threshold is evaluated only after a first predetermined interval has elapsed after the first switch is turned on.

5. The apparatus of claim 1 further comprising a second current sensor having a second output, the second current sensor connected in series with the second switch;

the control logic characterized in that upon the condition of the second output being indicative of current in excess of a third predetermined threshold, the control logic actuates the control line whereby the oscillator oscillates, yielding an oscillating signal at the oscillator output;

the control logic further characterized in that upon the condition of the second output being indicative of current below a fourth predetermined threshold, the control logic deactuates the control line whereby the oscillator cease oscillation.

6. The apparatus of claim 5 wherein the control logic is further characterized in that the condition of the second output being indicative of current in excess of the third predetermined threshold is evaluated only after a second predetermined interval has elapsed after the first switch is turned on.

7. The apparatus of claim 1 further comprising an integrated circuit dependent upon an external clock signal at a clock terminal, the clock terminal connected with the second terminal.

8. The apparatus of claim 7 wherein the integrated circuit is a microcontroller.

9. The apparatus of claim 1 wherein the oscillator is an RC oscillator.

10. A method for use with apparatus having first, second, and third terminals, the apparatus powered by the first and third terminals, the apparatus having a first switch and a current sensor between the first terminal and the second terminal and a second switch between the third terminal and the second terminal, the method comprising the steps of:

detecting any current flow between a first one of the first and third terminals and the second terminal;

in the event of the current flow being in excess of a first predetermined threshold, repeatedly turning on the first and second switches in alternation;

in the event of the current flow being below a second predetermined threshold, ceasing the repeated turning on the first and second switches in alternation.

11. The method of claim 10 wherein the condition of the current flow being in excess of a first predetermined threshold is evaluated only after a first predetermined interval has elapsed after any turning on of the first switch.

12. An apparatus with first, second, third and fourth terminals, the apparatus comprising:

an oscillator having a control line, the oscillator responding to the control line being in a first state by providing an oscillator output;

control logic powered by the first and third terminals, the control logic connected with and controlling the control line;

a first switch having a first output in series between a first one of the first and third terminals via and the second terminal, the first switch controlled by the control logic, the first output connected with and provided to the control logic;

a second switch connected to a second one of the first and third terminals, and connected to the second terminal, the second switch controlled by the control logic;

an XOR gate having an output and receiving inputs from the second terminal and from the fourth terminal, the control logic characterized in that upon the condition of the XOR gate output being high, the control logic actuates the control line whereby the oscillator oscillates, yielding an oscillating signal at the oscillator output;

the control logic responsive to the oscillating signal by repeatedly turning on the first and second switches in alternation according to the oscillating signal;

the control logic further characterized in that upon the condition of the XOR gate output being low, the control logic deactuates the control line whereby the oscillator ceases oscillation;

the control logic comprising means preventing simultaneous turning on of the first switch and the second switch.

13. The apparatus of claim 12 wherein the control logic is further characterized in that the condition of the XOR output being high or low is evaluated shortly before a change of state of the oscillator output.

14. The apparatus of claim 12 further comprising an integrated circuit dependent upon an external clock signal at a clock terminal, the clock terminal connected with the second terminal.

15. The apparatus of claim 14 wherein the integrated circuit is a microcontroller.

16. The apparatus of claim 12 wherein the oscillator is an RC oscillator.

17. A method for use with apparatus having first, second, third and fourth terminals, the apparatus powered by the first and third terminals, the apparatus having a first switch between the first terminal and the second terminal and a second switch between the third terminal and the second terminal, the method comprising the steps of:

detecting the states of the second and fourth terminals;

in the event of the states of the second and fourth terminals being different, repeatedly turning on the first and second switches in alternation;

in the event of the states of the second and fourth terminals being the same, ceasing the repeated turning on the first and second switches in alternation.

18. The method of claim 17 wherein the condition of the second and fourth terminals being different or the same is evaluated shortly before a change in the output of the apparatus.

* * * * *